(12) United States Patent
Cho

(10) Patent No.: US 8,853,608 B2
(45) Date of Patent: Oct. 7, 2014

(54) IMAGE SENSOR

(75) Inventor: Kwang Jun Cho, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 276 days.

(21) Appl. No.: 13/412,832

(22) Filed: Mar. 6, 2012

(65) Prior Publication Data

US 2013/0032691 A1    Feb. 7, 2013

(30) Foreign Application Priority Data

Aug. 5, 2011   (KR) .......................... 10-2011-0078251

(51) Int. Cl.
*H01L 27/00* (2006.01)
*G01J 1/44* (2006.01)
*H04N 5/357* (2011.01)
*H01L 27/146* (2006.01)

(52) U.S. Cl.
CPC ............... *G01J 1/44* (2013.01); *H04N 5/3575* (2013.01); *H01L 27/14609* (2013.01); *H01L 27/14612* (2013.01)
USPC ............... 250/208.1; 250/214 R; 250/214 C; 348/295; 348/303; 348/308

(58) Field of Classification Search
CPC .................. H01L 27/14609; H01L 27/14612; H04N 5/357; H04N 5/3575; H04N 5/363
USPC .... 250/208.1, 214 R, 214 C, 214 P; 348/294, 348/295, 299, 303, 308, 314
See application file for complete search history.

(56) References Cited

U.S. PATENT DOCUMENTS

2011/0068257 A1    3/2011   Maeda et al.
2013/0161494 A1*   6/2013   Sohn ......................... 250/214 P

FOREIGN PATENT DOCUMENTS

| JP | 2009171027 A | 7/2009 |
| JP | 2011071631 A | 7/2011 |
| KR | 100724254 B1 | 5/2007 |
| KR | 1020100011676 A | 2/2010 |

* cited by examiner

*Primary Examiner* — Kevin Pyo
(74) *Attorney, Agent, or Firm* — William Park & Associates Patent Ltd.

(57) ABSTRACT

An image sensor for reducing a sampling time by shortening a stabilization duration is provided. The image sensor includes a pixel unit, a sampling unit sampling a signal from an output node of the pixel unit, a sinking unit sinking current from the output node of the pixel unit, and a current controller controlling the amount of current in the sinking unit.

10 Claims, 6 Drawing Sheets

IMAGE SENSOR

CROSS-REFERENCE TO RELATED APPLICATIONS

This application claims the priority of Korean Patent Application No. 10-2011-0078251 filed on Aug. 5, 2011, in the Korean Intellectual Property Office, the disclosure of which is incorporated by reference.

BACKGROUND OF THE INVENTION

1. Field of the Invention

The present invention relates to an image sensor.

2. Description of the Related Art

In general, an image sensor is a semiconductor device for converting an optical image into an electrical signal. The image sensor may be configured as shown in FIG. 1.

With reference to FIG. 1, the related art image sensor may include a pixel unit 11, a sampling unit 12, an analog-to-digital converter (ADC) 13, a driving current supply unit 14, or the like. The pixel unit 11 may include a floating diffusion capacitor Cfd, a photo diode PD, a reset transistor Q1, a transmission transistor Q2, a source follower transistor Q3, and row selection transistor Q4. The sampling unit 12 may include a signal capacitor Cs, a reset capacitor Cr, a reset sampling transistor Q5, and a signal sampling transistor Q6. The driving current supply unit 14 may include a current transistor Q7.

The operation of the image sensor illustrated in FIG. 1 will now be described with reference to FIG. 2.

In order to sample a reset level of the pixel unit 11, the reset transistor Q1 and the reset sampling transistor Q5 are turned on. Then, a floating diffusion (FD) node is initialized, and a voltage level of an output node OUT is changed according to a voltage level of the FD node. At this time, the reset sampling transistor Q5 stores the voltage level of the output node OUT in the reset capacitor Cr.

In order to sample a signal level of the pixel unit 11, in the state in which the FD node is initialized, the reset transistor Q1 and the reset sampling transistor Q5 are turned off and the transmission transistor Q2 and the signal sampling transistor Q6 are turned on. Then, optical charges accumulated in the photo diode PD move to the FD node to change the voltage level of the output node OUT, and the signal sampling transistor Q6 stores the voltage level of the output node OUT in the signal capacitor Cs.

When signals are stored in both of the reset capacitor Cr and the signal capacitor Cs through the foregoing process, the sampling unit 12 provides a voltage difference between the reset capacitor Cr and the signal capacitor Cs to the ADC 13, thus obtaining an image signal from which reset noise has been canceled.

However, the image sensor configured and operated as described above may generate noise due to coupling of the FD node when the reset transistor Q1 and the transmission transistor Q2 operate.

In order to prevent a signal with noise from being stored in the sampling capacitors Cr and Cs, the output node OUT must be completely discharged after the operation of the reset transistor Q1 and the transmission transistor Q2, and then, a follow-up operation must be performed. Namely, the follow-up operation must be performed after securing sufficient stabilization duration (ΔSTprevious).

However, a rate of voltage drop in the output node OUT may be very slow, as compared with the FD node. Namely, as shown in FIG. 3, the voltage level of the FD node is immediately reduced as the transmission transistor Q2 is turned off, while the voltage level of the output node OUT is gradually reduced. This is because the signal capacitor Cs is connected to the output node OUT, so the discharge rate of the signal capacitor Cs affects the rate of voltage drop in the output node OUT. Also, when the amount of driving current provided by the driving current supply unit 14 is small, the driving capabilities of the source follower transistor Q3 and the row selection transistor Q4 are degraded, further lowering the rate of voltage drop in the output node OUT.

Thus, in the related art, a long stabilization duration (ΔSTprevious) must be secured due to the slow rate of voltage drop in the output node OUT, resulting in an increase in sampling time that limits the frame rate of the image sensor.

SUMMARY OF THE INVENTION

An aspect of the present invention provides an image sensor capable of reducing a sampling time by shortening an image sensor stabilization duration.

According to an aspect of the present invention, there is provided an image sensor including a pixel unit, a sampling unit configured to sample a signal from an output node of the pixel unit, a sinking unit configured to sink current from the output node of the pixel unit, and a current controller configured to control the amount of current in the sinking unit.

Another embodiment of the invention provides sampling by a sampling unit a pixel signal output by a pixel unit, sinking by a sinking unit the current of the pixel signal output by the pixel unit, and controlling by a controlling unit the amount of current being sunk the sinking unit.

BRIEF DESCRIPTION OF THE DRAWINGS

The above and other aspects, features, and advantages of the present invention will be more clearly understood from the following detailed description taken in conjunction with the accompanying drawings, in which.

DETAILED DESCRIPTION OF THE PREFERRED EMBODIMENT

Figure 1:
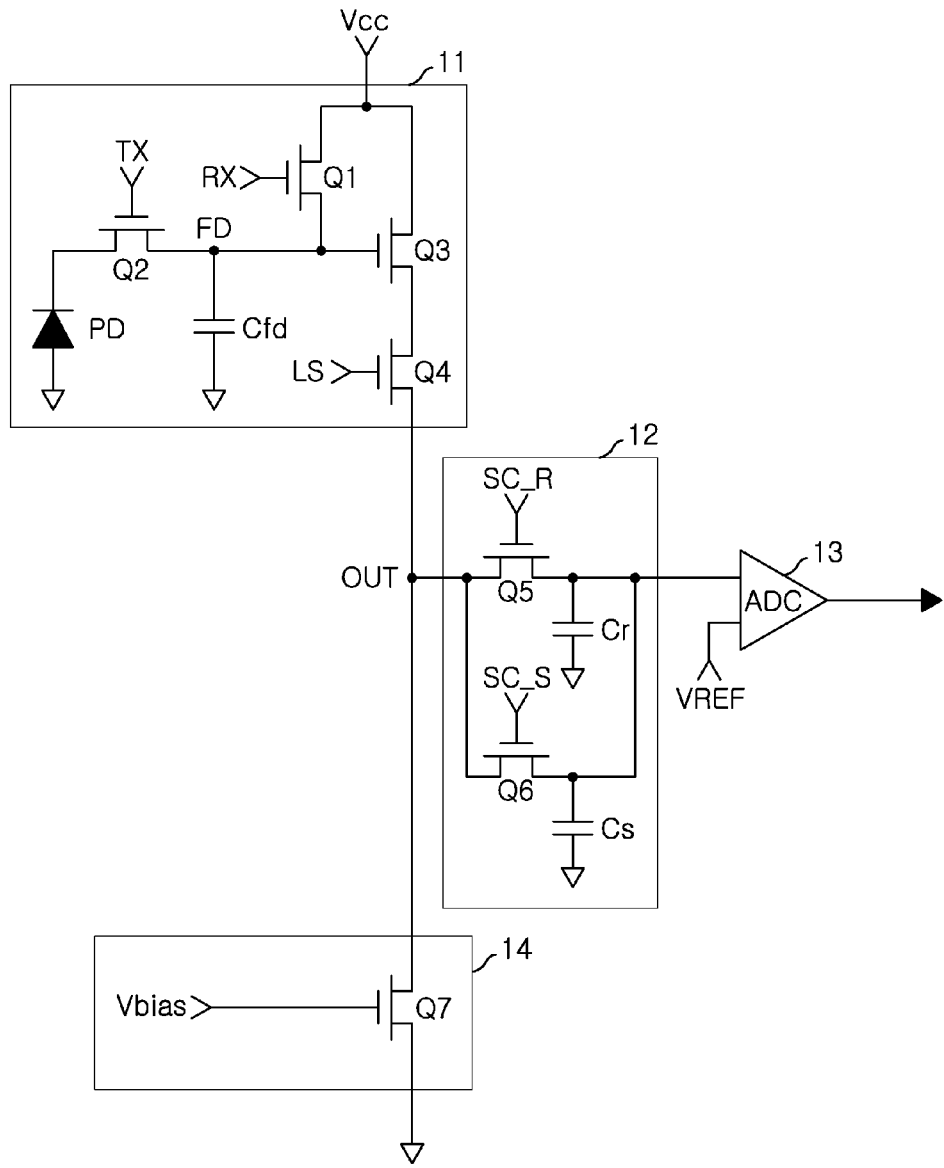
FIG. 1 is a circuit diagram of an image sensor according to the related art.
Figure 2:
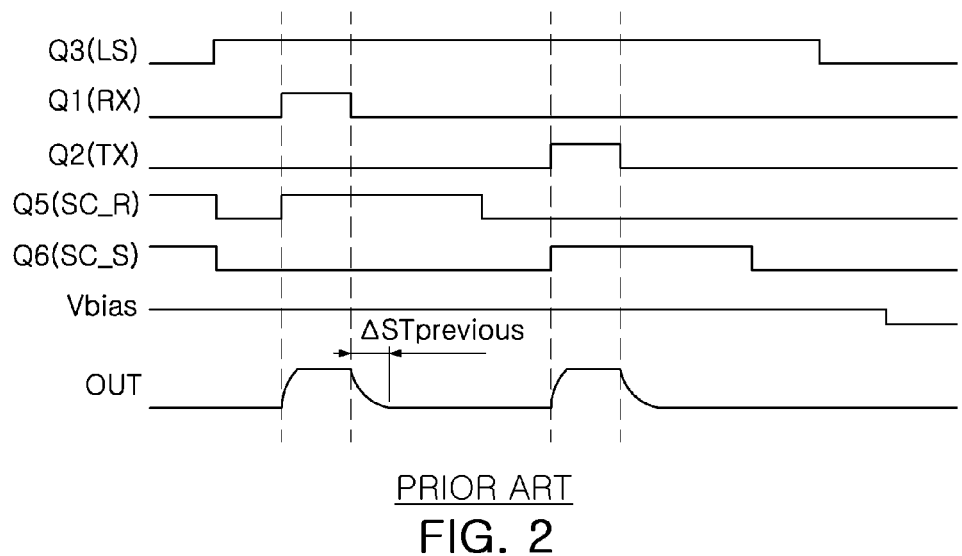
FIG. 2 is a signal timing diagram explaining the operation of the image sensor according to the related art.
Figure 3:
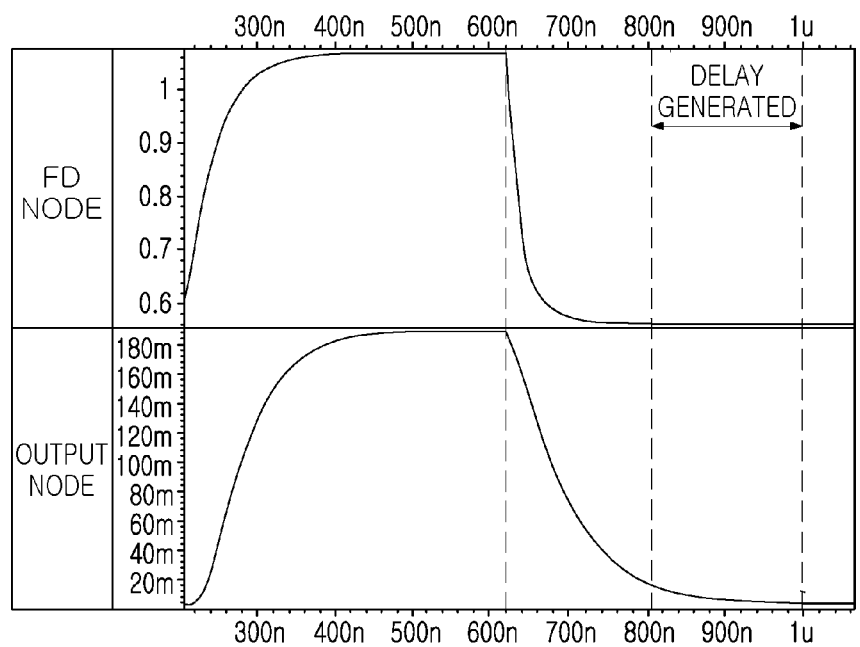
FIG. 3 is a view showing voltage levels of a floating diffusion (FD) node and an output node that vary according to the operation of a transmission transistor, according to the related art.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like components.

Throughout the specification and claims, unless explicitly described to the contrary, the word "comprise" and variations such as "comprises" or "comprising," will be understood to imply the inclusion of stated elements, but not the exclusion of any other elements.

Figure 4:
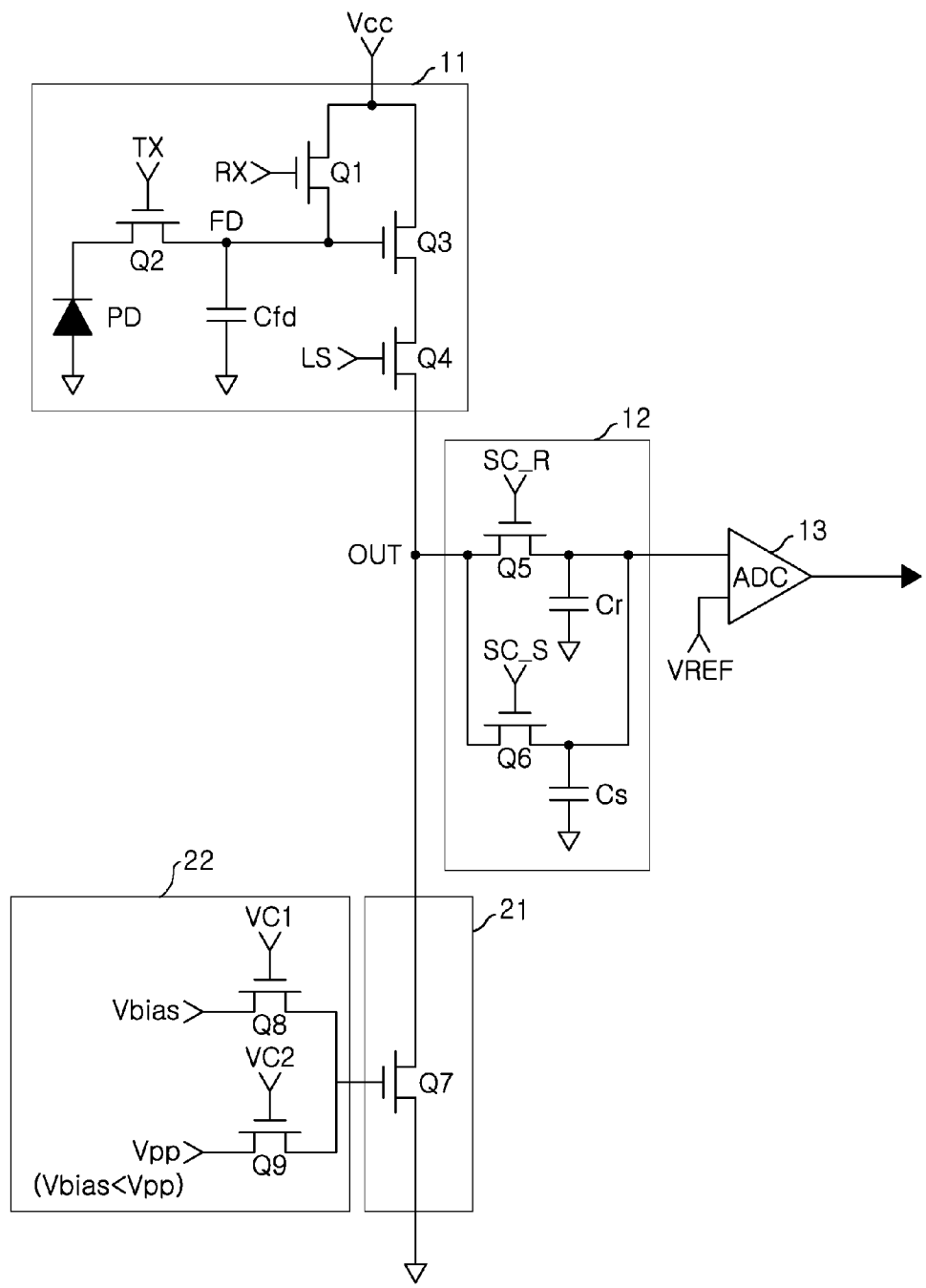
FIG. 4 is a circuit diagram of an image sensor according to an embodiment of the present invention.

FIG. 4 is a circuit diagram of an image sensor according to an embodiment of the present invention.

As shown in FIG. 4, an image sensor according to an embodiment of the present invention may include a pixel unit 11 accumulating a quantity of light through a photo diode PD and outputting a corresponding pixel signal; a sampling unit 12 sampling a signal from an output node OUT of the pixel unit 11, an analog-to-digital converter (ADC) 13 converting a sampling result from the sampling unit 12 into a digital signal and outputting the digital signal, a sinking unit 21 sinking the output node OUT of the pixel unit 11, and a current controller 22 controlling the amount of current flowing through the sinking unit 21.

The current controller 22 may vary the amount of current flowing through the sinking unit 21 according to an operational state of the image sensor. For example, when the pixel unit 11 does not generate the pixel signal, the current controller 22 may output a control signal to the sinking unit 21 to make a first amount of current flow through the sinking unit 21, and when the pixel unit 11 generates the pixel signal, the current controller 22 may output a control signal to the sinking unit 21 to make a second amount of current, greater than the first amount of current, flow through the sinking unit.

To this end, the sinking unit 21 may include a current transistor Q7 connected between the output node OUT and a ground. The current controller 22 may include a first control transistor Q8 connected between a terminal to which a bias voltage Vbias is applied and a gate of the current transistor Q7. A first voltage control signal VC1 is applied to a gate of the first control transistor Q8. A second control transistor Q9 is connected between a terminal to which a boosted voltage Vpp, higher than the bias voltage Vbias, is applied and the gate of the current transistor Q7. A second voltage control signal VC2 is applied to a gate of the second control transistor Q9. Thus, when the first voltage control signal VC1 is activated, the first control transistor Q8 supplies the existing bias voltage Vbias as a gate voltage of the current transistor Q7. When the second voltage control signal VC2 is activated, the second control transistor Q9 supplies the boosted voltage Vpp, higher than the existing bias voltage Vbias, as a gate voltage of the current transistor Q7.

The first voltage control signal VC1 and the second voltage control signal VC2 may be generated and provided by a timing generator (not shown) controlling the operation of the image sensor. The second voltage control signal VC2 is activated in a pixel signal generation section (e.g., an activation signal of a reset signal RX and a transmission signal TX) of the pixel unit 11, and the first voltage control signal VC1 may be activated in other sections.

The pixel unit 11 may include a floating diffusion capacitor Cfd connected to a floating diffusion (FD) node, a photo diode PD performing photoelectric conversion, a reset transistor Q1 resetting the FD node according to a reset signal RX, a transmission transistor Q2 transmitting electric charges accumulated in the photo diode PD according to a transmission signal TX, a source follower transistor Q3 source-following a voltage level of the FD node to generate a pixel signal, and a row selection transistor Q4 outputting a pixel signal to the output node OUT according to a row selection signal LS.

The sampling unit 12 may include a signal capacitor Cs, a reset capacitor Cr, a reset sampling transistor Q5 storing a pixel signal in the reset capacitor Cr according to a reset sampling signal SC_R, and a signal sampling transistor Q6 storing a pixel signal in the signal capacitor Cs according to a signal sampling signal SC_S.

In the above description, the transistors are implemented as NMOS transistors. However, the implementation methods may be diversified in actual application examples. Namely, the transistors may be implemented as NMOS transistors, PMOS transistors, a structure in which the PMOS transistors and the NMOS transistors are complementarily coupled, or other types of transistors or devices that may be suitable.

While the pixel unit 11 is generating a pixel signal (namely, while the sampling unit 12 is sampling a reset level as the reset signal RX is activated, or while the sampling unit 12 is sampling a signal level as the transmission signal Tx is activated), the current controller 22 applies the boosted voltage Vpp, instead of the bias voltage Vbias, to the gate of the current transistor Q7, thereby increasing the amount of driving current in the image sensor. As a result, a stabilization duration of the output node OUT is shortened, according to the increased amount of driving current, and the sampling time of the image sensor can be reduced by the shortened stabilized duration.

Figure 5:
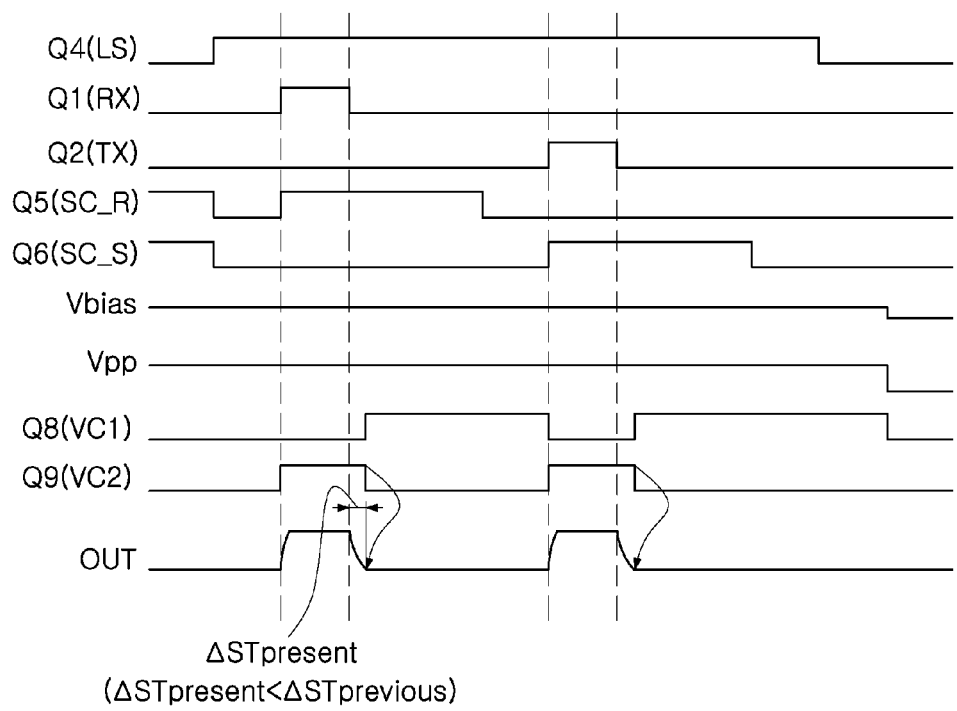
FIG. 5 is a signal timing diagram explaining the operation of the image sensor according to an embodiment of the present invention.

FIG. 5 is a signal timing diagram explaining the operation of the image sensor according to an embodiment of the present invention.

First, the row selection transistor Q4 is turned on to make the pixel unit 11 be in a state in which a pixel signal can be output.

Next, in order to sample a reset level of the pixel unit 11, the second control transistor Q9, the reset transistor Q1, and the reset sampling transistor Q5 are turned on. Accordingly, the current controller 22 applies the boosted voltage Vpp, higher than the bias voltage Vbias, to the gate of the current transistor Q7 of the sinking unit 21. Accordingly, the driving current in the image sensor is increased. In this state, when the FD node is initialized by the reset transistor Q1, the voltage level of the output node OUT is changed according to a voltage level of the initialized FD node, and the changed voltage level of the output node OUT is stored in the reset capacitor Cr. At this time, driving capabilities of the source follower transistor Q3 and the row selection transistor Q4 are also improved due to the increased driving current, whereby the voltage level of the output node OUT can be quickly changed in comparison to the related art.

When the reset transistor Q1 is turned off, the FD node is immediately reduced and the voltage level of the output node OUT starts to be reduced in response. The voltage level of the output node OUT is reduced at high speed in comparison to the related art in FIG. 1. This is because the driving capabilities of the source follower transistor Q3 and the row selection transistor Q4 have been improved, according to the increased amount of driving current, and a discharge rate of the reset capacitor Cr connected to the output node OUT has also risen, according to the increased amount of driving current.

When the output node OUT is completely discharged, the first control transistor Q8 is turned on instead of the second control transistor Q9, and the current controller 22 applies the existing bias voltage Vbias instead of the boosted voltage Vpp to the gate of the current transistor Q7 of the sinking unit 21. Accordingly, the driving current in the image sensors is relatively reduced.

In this manner, in an embodiment of the present invention, the stabilization duration (ΔSTpresent) is shortened by increasing the amount of driving current. Also, the voltage of the output node OUT can be quickly changed according to a change in the voltage of the FD node.

The same effect appears in the section in which a signal level of the pixel unit 11 is sampled. This will be described as follows.

First, in order to sample optical electric charges accumulated in the photo diode PD, the transmission transistor Q2 and the signal sampling transistor Q6 are turned on. At this time, the second control transistor Q9 is also turned on. Namely, the current controller 22 applies the boosted voltage Vpp to the gate of the current transistor Q7 of the sinking unit 21. Accordingly, the image sensor driving current flowing through the sinking unit 21 is increased.

Also, when the optical electric charges of the photo diode PD are supplied to the FD node to change the voltage level of the FD node, the voltage level of the output node OUT is also changed accordingly, and the changed voltage level of the output node OUT is stored in the reset capacitor Cr. At this time, the driving capabilities of the source follower transistor Q3 and the row selection transistor Q4 are improved by the increased driving current, and accordingly, the voltage level of the output node OUT is quickly changed.

Thereafter, when the transmission transistor Q2 is turned off, the FD node is immediately reduced, and the voltage level of the output node OUT is also immediately reduced by using the increased driving current. Namely, the rate of voltage drop in the output node OUT is increased because the driving capabilities of the source follower transistor Q3 and the row selection transistor Q4 have been improved by the increased amount of driving current and the discharge rate in the signal capacitor Cs.

Thereafter, when the output node OUT is completely discharged, the first control transistor Q8 is turned on instead of the second control transistor Q9, and the current controller 22 applies the bias voltage Vbias to the gate of the current transistor Q7 of the sinking unit 21. Accordingly, the image sensor's driving current is relatively reduced.

Accordingly, even in the signal level sampling section, the stabilization duration (ΔSTpresent) can be shortened. Also, the voltage of the output node OUT can be more quickly changed.

In this manner, in an embodiment of the present invention, since the stabilization duration (ΔSTpresent) of the output node OUT is shortened by the driving current, the sampling time of the image sensor can be reduced. Also, since a follow-up operation is performed after the output node OUT is sufficiently stabilized, stable image sensor performance can be secured.

In addition, in another embodiment of the present invention, power consumption can be reduced by adjusting a turn-on section of the first control transistor Q8.

Figure 6:
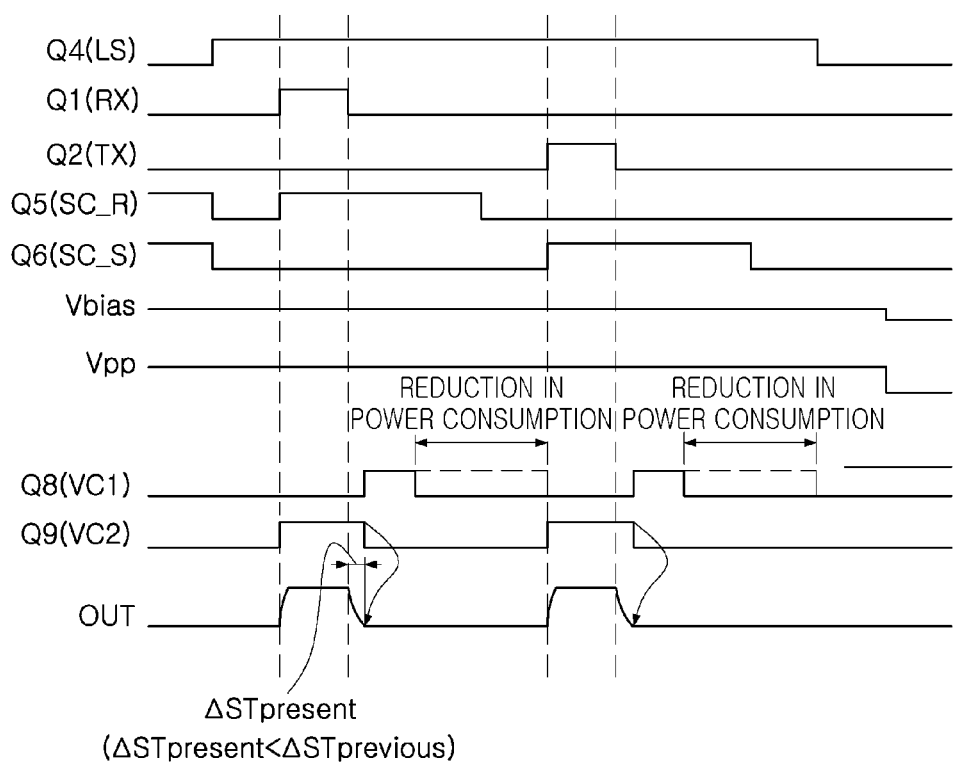
FIG. 6 is a signal timing diagram explaining the operation of the image sensor according to another embodiment of the present invention.

Namely, in FIG. 5, the first control transistor Q8 is unconditionally turned on when the second control transistor Q9 is turned off, but in FIG. 6, the turn-on section of the first control transistor Q8 can be minimized to prevent power from being unnecessarily consumed.

Figure 7:
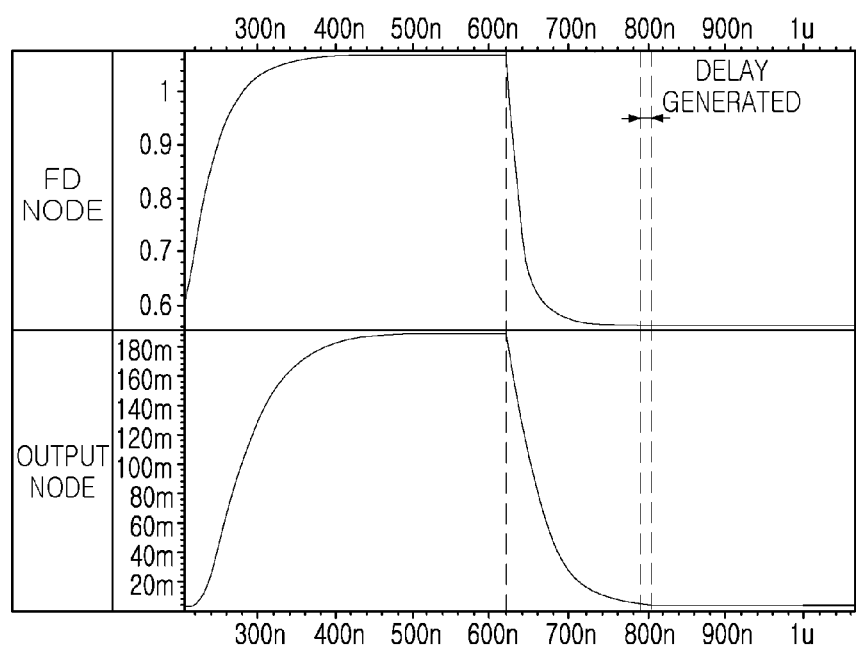
FIG. 7 is a view showing voltage levels of a floating diffusion (FD) node and an output node that vary according to the operation of a transmission transistor according to an embodiment of the present invention.

FIG. 7 is a view showing voltage levels of a floating diffusion (FD) node and an output node that vary according to the operation of a transmission transistor according to an embodiment of the present invention.

With reference to FIG. 7, when the transmission transistor Q2 is turned on, the voltage level of the FD node and that of the output node OUT are changed at a similar rate. Thus, response delay can be reduced and stabilization time can be shortened proportionally.

As set forth above in various embodiments of the invention, since the stabilization time of the output node OUT is shortened by appropriately controlling the amount of driving current, the sampling time can be reduced, and accordingly, the frame rate of the image sensor can be increased.

While the present invention has been shown and described in connection with the embodiments, it will be apparent to those skilled in the art that modifications and variations can be made without departing from the spirit and scope of the invention as defined by the appended claims.

What is claimed:

1. An image sensor comprising:
a sampling unit configured to sample a pixel signal from an output node of a pixel unit;
a sinking unit comprising a current transistor connected between the output node of the pixel unit and a ground, and configured to sink current from the output node of the pixel unit; and
a current controller configured to control the amount of current in the sinking unit, wherein the current controller comprises:
a first control transistor configured to provide a first voltage to a gate of the current transistor when the sampling unit does not sample a pixel signal from the output node of the pixel unit; and
a second control transistor configured to provide a second voltage larger than the first voltage to the gate of the current transistor when the sampling unit samples the pixel signal from the output node of the pixel unit.

2. The image sensor of claim 1, wherein the second control transistor is configured to be turned on when the pixel signal is requested to be generated, and configured to be turned off when the generation of the pixel signal is terminated and the output node of the pixel unit is discharged.

3. The image sensor of claim 1, wherein the first control transistor is configured to be turned on when the generation of the pixel signal is terminated and the output node of the pixel unit is discharged, and configured to be turned off when the generation of the pixel signal is requested.

4. The image sensor of claim 1, wherein the first control transistor is configured to be temporarily turned on when the generation of the pixel signal is terminated and the output node of the pixel unit is discharged, and then the first control transistor is configured to be turned off again.

5. The image sensor of claim 1, wherein the sampling unit comprises:
a sampling capacitor; and
a sampling transistor configured to store a pixel signal from the output node of the pixel unit in the sampling capacitor and discharge the sampling capacitor through the sinking unit.

6. A method for sensing an image, comprising:
sampling by a sampling unit a pixel signal output by a pixel unit;
sinking by a sinking unit the current of the pixel signal output by the pixel unit;
controlling by a controlling unit the amount of current sunk by the sinking unit;
providing by a first control transistor a first voltage to a gate of a current transistor in the controlling unit when the sampling unit does not sample the pixel signal from the pixel unit; and providing by a second control transistor a second voltage larger than the first voltage to the gate of the current transistor when the sampling unit samples the pixel signal from the pixel unit.

7. The method of claim 6, wherein the second control transistor is turned on when the pixel signal is to be generated by the pixel unit, and turned off when the generation of the pixel signal is terminated and an output node of the pixel unit is discharged.

8. The method of claim 6, wherein the first control transistor is turned on when the generation of the pixel signal is terminated and an output node of the pixel unit is discharged, and turned off when the pixel signal is to be generated.

9. The method of claim 6, wherein the first control transistor is turned off after the first control transistor is temporarily turned on when the generation of the pixel signal is terminated and the output node of the pixel unit is discharged.

10. The method of claim 6, wherein the sampling unit stores a signal from an output node of the pixel unit and discharges the stored signal through the sinking unit.

* * * * *